United States Patent
Wang et al.

(10) Patent No.: US 10,283,348 B2
(45) Date of Patent: May 7, 2019

(54) HIGH TEMPERATURE ATOMIC LAYER DEPOSITION OF SILICON-CONTAINING FILMS

(71) Applicant: Versum Materials US, LLC, Allentown, PA (US)

(72) Inventors: Meiliang Wang, San Marcos, CA (US); Xinjian Lei, Vista, CA (US); Anupama Mallikarjunan, San Marcos, CA (US); Haripin Chandra, San Marcos, CA (US); Bing Han, San Marcos, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/404,376

(22) Filed: Jan. 12, 2017

(65) Prior Publication Data

US 2017/0207082 A1 Jul. 20, 2017

Related U.S. Application Data

(60) Provisional application No. 62/280,886, filed on Jan. 20, 2016.

(51) Int. Cl.
*H01L 21/31* (2006.01)
*H01L 21/02* (2006.01)
(Continued)

(52) U.S. Cl.
CPC ...... *H01L 21/02164* (2013.01); *C23C 16/401* (2013.01); *C23C 16/4408* (2013.01);
(Continued)

(58) Field of Classification Search
CPC .......... H01L 21/02164; H01L 21/0228; H01L 21/02214; C23C 16/45553;
(Continued)

(56) References Cited

U.S. PATENT DOCUMENTS

| 3,642,851 A | 2/1972 | Bennett |
| 6,013,740 A | 1/2000 | Burns |

(Continued)

FOREIGN PATENT DOCUMENTS

| EP | 2650399 A2 | 10/2013 |
| JP | H08165294 A | 6/1996 |

OTHER PUBLICATIONS

Deal, B. E. and Grove, A. S., "General Relationship for the Thermal Oxidation of Silicon," Journal of Applied Physics, vol. 36, No. 12, Dec. 1965, pp. 3770-3778.

*Primary Examiner* — Anthony Ho
*Assistant Examiner* — Mohammad M Hoque
(74) *Attorney, Agent, or Firm* — Joseph D. Rossi (57) ABSTRACT

A method and composition for depositing a silicon oxide film in an atomic layer deposition process at one or more temperatures of 650° C. or greater is provided. In one aspect, there is provided a method to deposit a silicon oxide film or material comprising the steps of: providing a substrate in a reactor; introducing into the reactor at least one halidosiloxane precursor selected from the group of compounds having formulae I and II described herein; purging the reactor with a purge gas; introducing an oxygen source into the reactor; and purging reactor with purge gas; and wherein the steps are repeated until a desired thickness of silicon oxide is deposited and the process is conducted at one or more temperatures ranging from about 650 to 1000° C.

13 Claims, 5 Drawing Sheets

(51) Int. Cl.
*C23C 16/40* (2006.01)
*C23C 16/44* (2006.01)
*C23C 16/455* (2006.01)
*C23C 16/46* (2006.01)

(52) U.S. Cl.
CPC .. *C23C 16/45542* (2013.01); *C23C 16/45553* (2013.01); *C23C 16/46* (2013.01); *H01L 21/0228* (2013.01); *H01L 21/02214* (2013.01); *H01L 21/02216* (2013.01)

(58) Field of Classification Search
CPC .......... C23C 16/4408; C23C 16/45542; C23C 16/46; C23C 16/401
USPC .......................................................... 438/762
See application file for complete search history.

(56) References Cited

U.S. PATENT DOCUMENTS

| | | | |
|---|---|---|---|
| 6,992,019 B2 | 1/2006 | Lee et al. | |
| 7,084,076 B2 | 8/2006 | Park et al. | |
| 7,498,273 B2 | 3/2009 | Mallick et al. | |
| 2004/0180557 A1* | 9/2004 | Park | C23C 16/402 438/787 |
| 2007/0111545 A1 | 5/2007 | Lee et al. | |
| 2011/0207283 A1* | 8/2011 | Haukka | C23C 16/402 438/381 |
| 2013/0295779 A1* | 11/2013 | Chandra | C23C 16/402 438/790 |
| 2014/0170858 A1 | 6/2014 | Harada et al. | |
| 2015/0275355 A1 | 10/2015 | Mallikarjunan et al. | |
| 2017/0170004 A1 | 6/2017 | Harada et al. | |

* cited by examiner

HIGH TEMPERATURE ATOMIC LAYER DEPOSITION OF SILICON-CONTAINING FILMS

This Application claims the benefit of U.S. Application No. 62/280,886, filed Jan. 20, 2016. The disclosure of Application No. 62/280,886 is hereby incorporated by reference.

FIELD OF THE INVENTION

Described herein is a composition and method for the formation of a silicon-containing film. More specifically, described herein is a composition and method for formation of a silicon oxide film at one or more deposition temperatures of about 500° C. or greater and using an atomic layer deposition (ALD) process.

BACKGROUND OF THE INVENTION

Thermal oxidation is a process commonly used to deposit high purity and highly conformal silicon oxide films such as silicon dioxide ($SiO_2$) in semiconductor applications. However, the thermal oxidation process has a very low deposition rate, e.g., than 0.0007 Å/s at 700° C. (see B. E. Deal and A. S. Grove "General Relationship for the Thermal Oxidation of Silicon." Journal of Applied Physics Vol 36, page 3770 (1965)) which makes it impractical for high volume manufacturing processes to be commercially adopted.

Atomic Layer Deposition (ALD) and Plasma Enhanced Atomic Layer Deposition (PEALD) are processes used to deposit silicon dioxide ($SiO_2$) conformal film at low temperatures (<500° C.). In both ALD and PEALD processes, the precursor and reactive gas (such as oxygen or ozone) are separately pulsed in certain number of cycles to form a monolayer of silicon dioxide ($SiO_2$) at each cycle. However, silicon dioxide ($SiO_2$) deposited at low temperatures using these processes may contain levels of impurities such as carbon (C), nitrogen (N), or both which are detrimental to semiconductor applications. To remedy this, one possible solution would be to increase the deposition temperature to a temperature greater than 500° C. However, at these higher temperatures, conventional precursors employed by semiconductor industries tend to self-react, thermally decompose, and deposit in CVD mode rather than ALD mode. The CVD mode deposition has reduced conformality compared to ALD deposition, especially for semiconductor applications that have high aspect ratio structures such as NAND and V-NAND. In addition, the CVD mode deposition has less control of film or material thickness than the ALD mode deposition.

US Publ. App. 2014/0170858 describes a method of forming a film including a predetermined element, oxygen and at least one element selected from a group consisting of nitrogen, carbon and boron on a substrate by performing a cycle a predetermined number of times, the cycle including supplying a source gas to the substrate wherein the source gas contains the predetermined element, chlorine and oxygen with a chemical bond of the predetermined element and oxygen, and supplying a reactive gas to the substrate wherein the reactive gas contains the at least one element selected from the group consisting of nitrogen, carbon and boron.

US Publ. App. 2007/0111545 describes a method of forming silicon dioxide layers using ALD to enhance deposition rate and improve step coverage in semiconductor device fabrication.

U.S. Pat. No. 7,498,273 describes a method of depositing a low-K dielectric layer in a gap formed on a substrate are described using siloxanes in PECVD which give films with low porosity, high etching selectivity, and fewer cracks. The methods include introducing an organo-Si precursor and an O precursor to a deposition chamber. The organo-Si precursor has a C: Si atom ratio of <8, and the O precursor comprises atomic O that is generated outside the deposition chamber.

U.S. Pat. No. 7,084,076 describes a method for forming a silicon dioxide film using atomic layer deposition (ALD), wherein a halogen- or NCO-substituted siloxane is used as a Si source.

US Publ. No. 2013/0295779 describes a composition and ALD for forming a silicon oxide containing film at one or more depositions temperatures of about 500° C. or greater.

The previously identified patents and patent applications are hereby incorporated by reference.

Thus, there is a need to develop a process for forming a high quality, low impurity, high conformal silicon oxide film using an atomic layer deposition (ALD) process or an ALD-like process, such as without limitation a cyclic chemical vapor deposition process, to replace thermal-based deposition processes at temperatures above 600 C for Vertical NAND (V-NAND) memory technology. Further, it may be desirable to develop a high temperature deposition (e.g., deposition at one or more temperatures of 650° C. or higher) to improve one or more film properties, such as purity and/or density, in an ALD or ALD-like process for the fabrication of V-NAND memory.

BRIEF SUMMARY OF THE INVENTION

Described herein is a method for the deposition of a silicon oxide material or film at high temperatures, e.g., at one or more temperatures of about 650° C. or greater, in an atomic layer deposition (ALD) or an ALD-like process. The silicon oxide films deposited using the composition or method described herein comprise at least one or more of the following attributes: a density of about 2.1 g/cm³ or greater; Wet Etching Rate (WER) in 0.5 wt. % dHF about 6 or less relative to thermal oxide; a carbon content is $2 \times 10^{19}$ atoms/cm³ or less.

In one aspect, there is provided a method to deposit a silicon oxide film or material comprising the steps of:

a. providing a substrate in a reactor;
b. introducing into the reactor at least one halidosiloxane precursor selected from the group of compounds having the following formulae I and II:

I

II wherein X=Cl, Br, or I; R and $R^1$ are each independently selected from a hydrogen atom, a $C_1$ to $C_3$ alkyl group; n=1, 2, or 3; m=0, 1, or 2; and p=0 or 1;

c. purging the reactor with a purge gas;
d. introducing an oxygen source into the reactor; and
e. purging reactor with purge gas; and where steps b through e are repeated until a desired thickness of silicon oxide is deposited; and wherein the process is conducted at one or more temperatures ranging from about 650 to 850° C. In this or other embodiments, the method is conducted at one or more pressures ranging from about 50 milliTorr (mTorr) to about 760 Torr. In this or other embodiments, the oxygen source is at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen (i.e. nitrous oxide N₂O or nitric oxide, NO), water vapor, water vapor plasma, a composition comprising water and ozone, hydrogen peroxide, ozone source, and combinations thereof.

In another aspect, there is provided a method to deposit a silicon oxide film or material comprising the steps of:
a. providing a substrate in a reactor;
b. introducing into the reactor at least one halidosiloxane precursor selected from the group of compounds having the following formulae I and II:

wherein X=Cl, Br, or I; R and R¹ are each independently selected from a hydrogen atom, a $C_1$ to $C_3$ alkyl group; n=1, 2, or 3; m=0, 1, or 2; and p=0 or 1;
c. purging reactor with purge gas;
d. introducing an oxygen source into the reactor;
e. purging reactor with purge gas;
f. introducing water vapor or hydroxyl source into the reactor;
g. purging reactor with purge gas; and
where steps b through g are repeated until a desired thickness of silicon oxide is deposited; and wherein the process is conducted at one or more temperatures ranging from 650 to 850° C.

In one or more embodiments of the method described above, the method is conducted at one or more pressures ranging from about 50 milliTorr (mTorr) to about 760 Torr.

In one or more embodiments of the method described above, the purge gas is selected from the group consisting of nitrogen, helium, argon and combinations thereof.

In one or more embodiments of the method described above, the oxygen source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen (i.e. nitrous oxide N₂O or nitric oxide, NO), water vapor, water vapor plasma, a composition comprising water and ozone, hydrogen peroxide, ozone source, and combinations thereof.

In a further aspect, there are provided a composition for depositing a silicon oxide film comprising at least one halidosiloxane precursor selected from the group of compounds having the following formulae I and II:

wherein X=Cl, Br, or I; R and R¹ are each independently selected from a hydrogen atom, a $C_1$ to $C_3$ alkyl group; n=1, 2, or 3; m=0, 1, or 2; and p=0 or 1. Examples of these halidosiloxane precursors are shown in the following Table I:

TABLE I

1,1,1,3,3,3-hexahalidodisiloxane

1,1,3,3-tetrahalido-1,3-dimethyldisiloxane

1,1,3,3-tetrahalidodisiloxane

1,3-dihalido-1,1,3,3-tetramethyldisiloxane

1,1,1,3,3,5,5-octahalidotrisiloxane 1,1,3,5,5-pentahalido-1,3,5-trimethyltrisiloxane

1,5-dihalido-1,1,3,3,5,5-hexamethyltrisiloxane 1,5-pentahalido-1,3,5-trimethyltrisiloxane One embodiment of the invention relates to a composition for use in depositing a silicon containing film comprising at least one halidosiloxane precursor selected from the group of compounds having the following formulae I and II:

wherein X=Cl, Br, or I; R and R¹ are each independently selected from a hydrogen atom, a $C_1$ to $C_3$ alkyl group; n=1, 2, or 3; m=0, 1, or 2; and p=0 or 1.

Another embodiment of the invention relates to a silicon containing film produced by any of the foregoing methods. A further embodiment of the invention relates to a silicon containing film having a density of about 2.1 g/cm3 or greater; Wet Etching Rate (WER) in 0.5 wt. % dHF about 6 or less relative to thermal oxide; a carbon content is 2×1019 atoms/cm3 or less.

The various aspects and embodiments of the invention can be used alone or in combinations with each other.

DETAILED DESCRIPTION OF THE INVENTION

Described herein are a method and composition for forming a silicon oxide film. The term silicon oxide film or material includes, without limitation, a stoichiometric or non-stoichiometric silicon oxide film, a silicon oxynitride film, a silicon oxycarbide film, a silicon oxycarbonitride film, and combinations thereof. In one particular embodiment, the silicon oxide film is deposited at one or more temperatures of about 650° C. or greater in an atomic layer deposition (ALD) or in an ALD-like deposition process, such as without limitation a cyclic chemical vapor deposition process (CCVD). Throughout the description, the term "ALD or ALD-like" denotes a process including, but not limited to, the following processes: a) each reactant including halidosilane precursor and reactive gas is introduced sequentially into a reactor such as a single wafer ALD reactor, semi-batch ALD reactor, or batch furnace ALD reactor; b) each reactant including halidosilane precursor and reactive gas is exposed to a substrate by moving or rotating the substrate to different sections of the reactor and each section is separated by inert gas curtain, i.e. spatial ALD reactor or roll to roll ALD reactor.

The method described herein uses at least one halidosiloxane precursor and an oxygen source in a cyclical process at one or more deposition temperatures ranging from about 650° C. to about 950° C. or from about one 700 to 850° C. to provide the silicon oxide film. In one embodiment of the deposition process described herein, the method comprises the following steps:

a. providing a substrate in a reactor;
b. introducing into the reactor at least one halidosiloxane precursor comprising at least one halidosiloxane precursor selected from the group of compounds having the following formulae I and II:

wherein X=Cl, Br, or I; R and R¹ are each independently selected from a hydrogen atom, a $C_1$ to $C_3$ alkyl group; n=1, 2, or 3; m=0, 1, or 2; and p=0 or 1;

c. purging the reactor with a purge gas;
d. introducing an oxygen source into the reactor; and
e. purging reactor with purge gas.

wherein steps b through e are repeated until desired thickness of the silicon oxide film is deposited on at least a surface of the substrate.

While not wishing to be bound by theory or explanation, it is believed that the at least one halidosiloxane precursor described herein should have at least one anchoring functionality as well as pre-existing Si—O—Si linkage, which reacts with certain reactive sites on the substrate surface to anchor a monolayer of Si—O—Si species which may function as barrier layer to prevent any unwanted interaction between the oxygen source and the substrate, especially during formation of the first few layers of silicon oxide as compared to conventional silicon precursors having only one silicon atom such as silicon tetrachloride or dimethylaminotrimethylsilane The anchoring functionalities can be selected from a halide (Cl, Br, I) group. The halidosiloxane precursor should also have a passive functionality in that it is chemically stable as to prevent further surface reaction, leading to a self-limiting process. The passivating functionality is selected from different alkyl groups such as halido such as Cl or Br, methyl, phenyl groups, preferably a Cl or methyl group. The remaining groups on the surface can then be oxidized to form more Si—O—Si linkages as well as hydroxyl groups. In addition, hydroxyl sources such as $H_2O$ or water plasma can also be introduced into the reactor to form more hydroxyl groups as reactive sites for the next ALD cycle.

As previously mentioned, there are provided a composition for depositing a silicon oxide film comprising at least one halidosiloxane precursor selected from the group of compounds having the following formulae I and II:

wherein X=Cl, Br, or I; R and R¹ are each independently selected from a hydrogen atom, a $C_1$ to $C_3$ alkyl group; n=1, 2, or 3; m=0, 1, or 2; and p=0 or 1. Examples of precursors having Formulae I or II include are but not limited to: 1,1,1,3,3,3-hexachlorodisiloxane, 1,1,3,3-tetrachlorodisiloxane, 1,1,3,3-tetrachloro-1,3-dimethyldisiloxane, 1,3-dichloro-1,1,3,3-tetramethyldisiloxane, 1,1,1,3,3,5,5,5-octachlorotrisiloxane, 1,1,3,5,5-pentachloro-1,3,5-trimethyltrisiloxane, 1,5-dichloro-1,1,3,3,5,5-hexamethyltrisiloxane, and 1,5-pentachloro-1,3,5-trimethyltrisiloxane.

In one particular embodiment, the halidosiloxane precursors are comprised of at least one anchoring functionality (e.g., Si—Cl) and at least one passivating functionality (e.g., Si-Me where Me is a methyl group). Examples of such precursors are provided in the following Table II:

TABLE II 1,1,1,3,3,3-hexachlorodisiloxane

TABLE II-continued

1,1,3,3-tetrachloro-1,3-dimethyldisiloxane

1,1,3,3-tetrachlorodisiloxane

1,3-dichloro-1,1,3,3-tetramethyldisiloxane

1,1,1,3,3,5,5,5-octachlorotrisiloxane 1,1,3,5,5-pentachloro-1,3,5-trimethyltrisiloxane 1,5-dichloro-1,1,3,3,5,5-hexamethyltrisiloxane 1,5-dichloro-1,3,5-trimethyltrisiloxane In certain embodiments, the silicon oxide films deposited using the methods described herein are formed in the presence of oxygen using an oxygen source, reagent or precursor comprising oxygen. An oxygen source may be introduced into the reactor in the form of at least one oxygen source and/or may be present incidentally in the other precursors used in the deposition process. Suitable oxygen source gases may include, for example, oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen (i.e. nitrous oxide $N_2O$ or nitric oxide, NO), water vapor, water vapor plasma, a composition comprising water and ozone, hydrogen peroxide, ozone source, and combinations thereof. In certain embodiments, the oxygen source comprises an oxygen source gas that is introduced into the reactor at a flow rate ranging from about 1 to about 10000 standard cubic centimeters (sccm) or about 1 to about 2000 standard cubic centimeters (sccm) or from about 1 to about 1000 sccm. The oxygen source can be introduced for a time that ranges from about 0.1 to about 100 seconds. In one particular embodiment, the oxygen source comprises water having a temperature of 10° C. or greater. In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In certain embodiments, the silicon oxide films further comprise nitrogen. In these embodiments, the films are deposited using the methods described herein and formed in the presence of nitrogen-containing source. A nitrogen-containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen, nitrogen/hydrogen, ammonia plasma, nitrogen plasma, nitrogen/hydrogen plasma, and mixture thereof. In certain embodiments, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 6000 sccm for about 0.1 to 1000 seconds, thereby purging the unreacted material and any byproduct that may remain in the reactor.

The respective step of supplying the precursors, oxygen source, the nitrogen-containing source, and/or other precursors, source gases, and/or reagents may be performed by changing the time for supplying them to change the stoichiometric composition of the resulting dielectric film.

The purge gas can combine with residual gas from a previous step to form a composition. For example, the composition can comprise the purge gas and at least one of the inventive precursors. The purge gas will comprise about 1% to about 95% of this composition.

Energy is applied to the at least one of the silicon precursor, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The at least one halidosiloxane precursor may be delivered to the reaction chamber such as a cyclic CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In one embodiment of the method described herein, a cyclic deposition process such as ALD-like, ALD, or PEALD may be used wherein the deposition is conducted using the at least one halidosiloxane precursor and an oxygen source. The ALD-like process is defined as a cyclic CVD process but still provides high conformal silicon oxide films.

In certain embodiments, the gas lines connecting from the precursor canisters to the reaction chamber are heated to one or more temperatures depending upon the process requirements and the container of the at least one halidosiloxane precursor is kept at one or more temperatures for bubbling. In other embodiments, a solution comprising the at least one halidosiloxane is injected into a vaporizer kept at one or more temperatures for direct liquid injection.

A flow of argon and/or other gas may be employed as a carrier gas to help deliver the vapor of the at least halidosiloxane to the reaction chamber during the precursor pulsing. In certain embodiments, the reaction chamber process pressure is about 1 Torr.

In a typical ALD or an ALD-like process such as a CCVD process, the substrate such as a silicon oxide substrate is heated on a heater stage in a reaction chamber that is exposed to the silicon precursor initially to allow the complex to chemically adsorb onto the surface of the substrate.

A purge gas, such as argon, purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

The inventive ALD process can achieve a film growth rate that can range from about 0.5 Å/cycle to about 4 Å/cycle, about 0.8 Å/cycle to about 3.5 Å/cycle and in some preferable cases about 1 Å/cycle to about 3.5 Å/cycle. The refractive index (RI) of the deposited film can range from about 1.35 to about 1.55, about 1.40 to about 1.50 and in some cases about 1.44 to about 1.48. The diluted HF (about 0.5 wt. % HF in deionized water) relative etch rate of the deposited films to thermal oxide can range from about 0.5 to about 8.0, about 1.0 to about 6.0 and in some preferable cases about 1.0 to about 4.0.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases may be performed by varying the duration of the time for supplying them to change the stoichiometric composition of the resulting dielectric film. The dielectric constant (k) of the deposited film can range from about 3.0 to about 6.0, about 3.5 to about 5.0 and in some preferable cases about 3.8 to about 4.2.

One particular embodiment of the method described herein to deposit a silicon oxide film on a substrate at one or more deposition temperatures of about 650 or greater comprises the following steps:
  a. providing a substrate in a reactor;
  b. introducing into the reactor at least halidosiloxane precursor having formulae I and II described herein;

c. purging reactor with purge gas;
  d. introducing an oxygen source into the reactor; and
  e. purging reactor with purge gas
wherein steps b through e are repeated until a desired thickness of the silicon oxide film is deposited.

Another embodiment of the method described herein introduces an oxygen source comprising a hydroxyl (e.g., OH fragments formed during the deposition process) such as $H_2O$ vapor or $H_2O$ plasma after the oxidizing step. In this embodiment, it is believed that the hydroxyl groups repopulate the surface to create reactive sites for halidosiloxane precursor which anchor on the surface to form the monolayer. The deposition steps are comprised of:
  a. providing a substrate in a reactor;
  b. introducing into the reactor at least one halidosiloxane having formulae I or II described above;
  c. purging reactor with purge gas;
  d. introducing an oxygen source comprising at least one selected from water, hydrogen peroxide, or a plasma comprising water into the reactor;
  e. purging reactor with purge gas;
  f. introducing oxygen source into the reactor; and
  g. purging reactor with purge gas
wherein steps b through g are repeated until desired thickness of silicon oxide film is deposited.

In an alternative embodiment of the method described herein, the deposition steps are comprised of:
  a. providing a substrate in a reactor;
  b. introducing into the reactor halidosiloxane at least halidosiloxane precursor having formulae I and II described herein;
  c. purging reactor with purge gas;
  d. introducing oxygen source into the reactor;
  e. purging reactor with purge gas;
  f. introducing an OH-containing source into the reactor; and
  g. purging reactor with purge gas
wherein steps b through g are repeated until desired thickness of silicon oxide film is deposited.

Yet another embodiment employs hydrogen peroxide, ozone, a composition comprising hydrogen and oxygen, or oxygen plasma to remove a passivating functionality or group such as methyl or chlorine. The deposition steps are as follows:

a. providing a substrate in a reactor;
b. introducing into the reactor halidosiloxane at least halidosiloxane precursor having formulae I and II described herein;
c. purging reactor with purge gas;
d. introducing a source comprising at least one selected from ozone, hydrogen peroxide, a composition comprising hydrogen and oxygen, and oxygen plasma into the reactor; and
e. purging reactor with purge gas wherein steps b through e are repeated until desired thickness of silicon oxide film is deposited.

In the method described herein, the at least one deposition temperature ranges from any one or more of the following endpoints: 650, 675, 600, 700, 725, 750, 775, 800, 825, 850, 875, 900, 925, 950, 975, or 1000° C. In certain embodiments, the at least one deposition temperature ranges from about 650° C. to about 1000° C.; or from about 650° C. to about 750° C.; or from about 700° C. to about 850° C.; or from about 750° C. to about 850° C.

Throughout the description, the term "step coverage" as used herein is defined as a percentage of two thicknesses of the deposited metal doped silicon nitride dielectric film in a structured or featured substrate having either vias or trenches or both, with bottom step coverage being the ratio (in %): thickness at the bottom of the feature is divided by thickness at the top of the feature, and middle step coverage being the ratio (in %): thickness on a sidewall of the feature is divided by thickness at the top of the feature. Films deposited using the method described herein exhibit a step coverage of about 60% or greater, about 70% or greater, about 80% or greater, or about 90% or greater which indicates that the films are conformal.

Throughout the description, therm "hydroxyl containing source" as used herein is refered an oxygen source having hydroxyl groups. Exempls include, but not limited to, water, water plasma, a composition comprising hydrogen and oxygen, a composition comprising hydrogen and ozone, a composition comprising water and oxygen, a composition comprising water and carbon dioxide, a composition comprising water and oxygen, a composition comprising water and ozone, a composition comprising water and nitrous oxide, a composition comprising water and nitric oxide, hydrogen peroxide ($H_2O_2$), a plasma generated from hydrogen and oxygen and combinations thereof.

Deposition pressure ranges are one or more pressures ranging from 50 miliTorr (mT) to 760 Torr, or from 500 mT-100 Torr. Purge gas can be selected from inert gas such as nitrogen, helium or argon. Oxidizer is selected from oxygen, peroxide, a mixture of oxygen and hydrogen, ozone or molecular oxygen from plasma process.

In one particular embodiment, the method described herein is conducted substantially free of a catalyst, such as an organoamine (e.g., pyridine, trimethylamine, see U.S. Pat. No. 7,084,076; hereby incorporated by reference). In this or another embodiment, the method described herein is conducted without requiring one or more annealing step.

The following Examples are provided to illustrate certain embodiments of the invention and shall not limit the scope of the appended claims.

WORKING EXAMPLES

Comparable Example 1a

Atomic Layer Deposition of Silicon Oxide Films with Silicon Tetrachloride

Atomic layer deposition of silicon oxide films were conducted using the following precursor: Silicon Tetrachloride ($SiCl_4$). The depositions were performed on a laboratory scale ALD processing tool. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12 inch long silicon strips. A thermocouple attached on the sample holder to confirm substrate temperature. Depositions were performed using ozone or H2O as oxygen source gas. Deposition parameters are provided in Table III, wherein the term pulse or dose is interchangeable, standing for the step of introducing silicon precursor or oxygen source into the reactor.

TABLE III

Process for Atomic Layer Deposition of Silicon Oxide Films with Oxygen Source Using $SiCl_4$

| Step 1 | 6 sec | Evacuate reactor | <100 mT |
|---|---|---|---|
| Step 2 | 2 sec | Dose silicon precursor | Reactor pressure typically <2 Torr |
| Step 3 | 6 sec | Purge reactor with nitrogen | Flow 1.5 slpm $N_2$ |
| Step 4 | 6 sec | Evacuate reactor | <100 mT |
| Step 5 | 10 sec | Dose oxygen source ozone or $H_2O$ | |
| Step 6 | 6 sec | Purge reactor with nitrogen | Flow 1.5 slpm $N_2$ |

Steps 1 to 6 were repeated until a desired thickness was reached. Thickness and Refractive Indices (RI) of the films were measured using a FilmTek 2000SE ellipsometer by fitting the reflection data from the film to a pre-set physical model (e.g., the Lorentz Oscillator model). Wet etch rate was performed using 1% solution of 49% hydrofluoric (HF) acid in deionized water (about 0.5 wt % HF). Thermal oxide wafers were used as reference for each batch to confirm solution concentration. Typical thermal oxide wafer Wet Etch Rate (WER) for 0.5 wt. % HF in deionized water solution is 0.5 Å/s. Film thickness before and after etch was used to calculate wet etch rate. Table IV summarizes SiO2 films properties deposited with a fixed dose (2 seconds) of the SiCl4 precursor with ozone or H2O as oxygen source at wafer temperature of 800° C. Growth rate or growth per cycle (GPC) is defined as the thickness of silicon oxide in angstrom (Å) divided by the number of cycles.

TABLE IV

Silicon Oxide Film Properties Deposited with $SiCl_4$ and Ozone or $H_2O$ as Oxygen Source

| Wafer temperature (Celsius) | Oxygen Source | Growth Rate (Å/cycle) | RI |
|---|---|---|---|
| 800 | ozone | 0.53 | 1.49 |
| 800 | $H_2O$ | 1.13 | 1.46 |

Depositions were also performed using both ozone and H2O as oxygen source gas. Deposition parameters are provided in Table V.

TABLE V

Process for Atomic Layer Deposition of Silicon Oxide
Films with SiCl$_4$ and Ozone plus H$_2$O as oxygen source

| Step 1 | 6 sec | Evacuate reactor | <100 mT |
|---|---|---|---|
| Step 2 | 2 sec | Dose silicon precursor | Reactor pressure typically <2 Torr |
| Step 3 | 6 sec | Purge reactor with nitrogen | Flow 1.5 slpm N$_2$ |
| Step 4 | 6 sec | Evacuate reactor | <100 mT |
| Step 5 | 10 sec | Dose ozone | |
| Step 6 | 6 sec | Purge reactor with nitrogen | Flow 1.5 slpm N$_2$ |
| Step 7 | 6 sec | Evacuate reactor | <100 mT |
| Step 8 | 10 sec | Dose H$_2$O | |
| Step 9 | 6 sec | Purge reactor with nitrogen | Flow 1.5 slpm N$_2$ |

Steps 1 to 9 were repeated until a desired thickness was reached. Table VI summarizes SiO2 films properties deposited with a fixed dose (2 seconds) of the SiCl4 precursor at wafer temperature of 800° C.

TABLE VI

Silicon Oxide Film Properties Deposited
with SiCl$_4$ and Ozone plus H$_2$O Process

| Wafer temperature (Celsius) | Growth Rate (Å/cycle) | RI |
|---|---|---|
| 800 | 1.05 | 1.46 |

To confirm ALD mode deposition, double precursor doses were used prior to introducing oxygen source to the reactor to ensure that the deposition is self-limiting. Deposition steps are listed below in Table VII and film properties is shown in Table VIII.

TABLE VII

ALD Conditions for Confirming ALD Mode Using SiCl$_4$

| Step 1 | 6 sec | Evacuate reactor | <100 mT |
|---|---|---|---|
| Step 2 | 4 sec | Double dosing Halidosiloxane precursor | Reactor pressure typically <2 Torr |
| Step 3 | 6 sec | Purge reactor with nitrogen | Flow 1.5 slpm N$_2$ |
| Step 4 | 6 sec | Evacuate reactor | <100 mT |
| Step 5 | 10 sec | Dose ozone | |
| Step 6 | 6 sec | Purge reactor with nitrogen | Flow 1.5 slpm N$_2$ |
| Step 7 | 6 sec | Evacuate reactor | <100 mT |
| Step 8 | 10 sec | Dose H2O | |
| Step 9 | 6 sec | Purge reactor with nitrogen | Flow 1.5 slpm N$_2$ |

TABLE VIII

Deposition Rate and Film Properties of SiO$_2$ films deposited
with SiCl$_4$ double dosing with Ozone or H$_2$O Process

| Wafer temperature (Celsius) | SiCl$_4$ dose | Growth Rate (Å/cycle) | RI |
|---|---|---|---|
| 800 | Single dosing | 1.05 | 1.46 |
| 800 | Double dosing | 0.78 | 1.56 |

Comparable Example 1 b

Atomic Layer Deposition of Silicon Oxide Films
with HCDSO at Temperature 600° C. or Below Atomic layer deposition of silicon oxide film was conducted with HCDSO and ozone as reactant using steps listed in Table III. GPC is 0.23 Å/cycle at 550° C. and 0.26 Å/cycle at 600° C. The relative WER in dHF (about 0.5 wt % HF in deionized water) compared to thermal oxide is about 9.2 at 550° C. and 7.8 at 600° C.

Example 1

Atomic Layer Deposition of Silicon Oxide Films
with Hexachlorodisiloxane at Substrate
Temperature Higher than 600° C.

Figure 1:
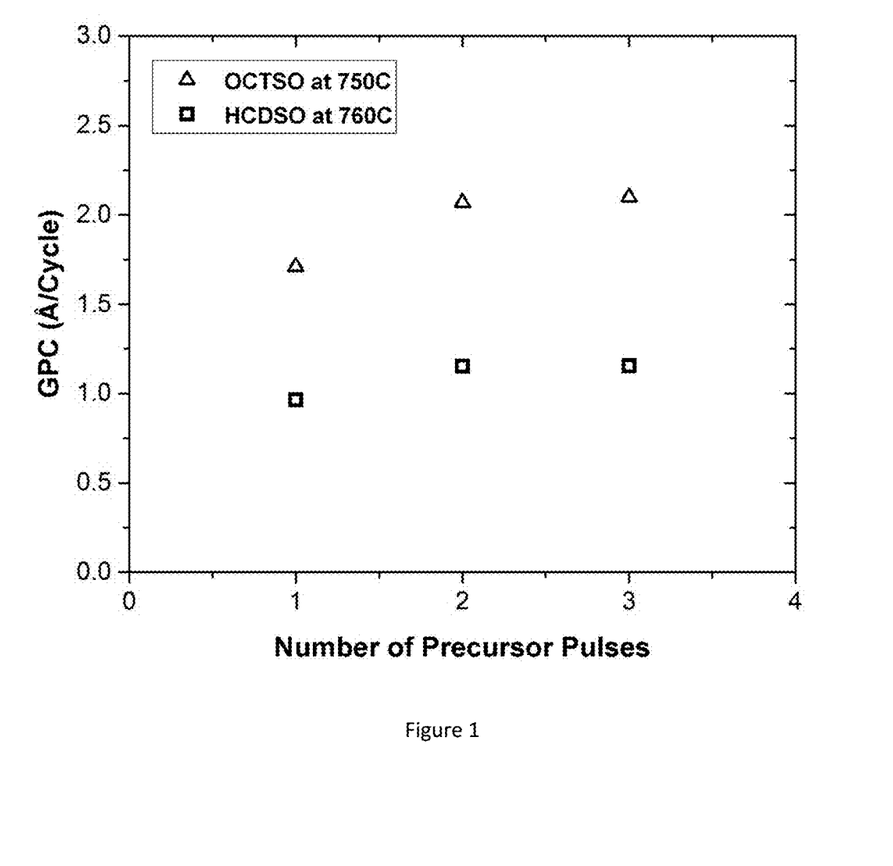
FIG. 1 illustrates the relationship between the growth per cycle of deposited silicon oxide films measured in Å/Cycle and silicon precursor pulse time (measured in seconds) for hexachlorodisiloxane (HCDSO) and octachlorotrisiloxane (OCTSO) at substrate temperatures of 760° C. and 750° C. respectively.

Atomic layer deposition of silicon oxide films were conducted with silicon Hexachlorodisiloxane (HCDSO) with different oxygen source using steps listed in Table III and Table V of Comparable Example 1a. Referring now to FIG. 1, FIG. 1 illustrates the growth rates that show self-limiting behavior and saturates with increasing number of precursor pulses which confirms ALD mode deposition at 760° C. Table IX summarizes deposition conditions and physical properties of silicon oxide deposited at temperatures ranging from 650 to 800° C., demonstrating HCDSO has much higher growth rate than SiCl4 under similar ALD conditions.

TABLE IX

Deposition Rate and Film Properties of SiO$_2$ films deposited
with HCDSO and Different Oxygen Source Process

| Wafer temperature (Celsius) | Oxygen Source | Growth Rate (Å/cycle) | Relative WER to thermal oxide | RI |
|---|---|---|---|---|
| 800 | ozone | 1.18 | 1.81 | 1.46 |
| 800 | Ozone and H$_2$O | 1.77 | 1.90 | 1.45 |
| 800 | H$_2$O | 1.48 | 2.06 | 1.46 |
| 750 | H$_2$O | 1.11 | 2.98 | 1.46 |
| 750 | Ozone | 1.09 | 2.92 | 1.46 |
| 750 | Ozone and H$_2$O | 1.22 | 2.94 | 1.45 |
| 650 | H$_2$O | 0.34 | 5.37 | 1.46 |

To confirm ALD mode deposition, double precursor doses were used prior to introducing oxygen source to the reactor to ensure that the deposition is self-limiting. Depositions were done using steps listed in Table VII of Example 1. Deposition rate and film properties deposited is shown in Table X.

TABLE X

Deposition Rates and Film properties of
SiO$_2$ Films Deposited with Double HCDSO Dosing

| Wafer temperature (Celsius) | HCDSO Dose | Growth Rate (Å/cycle) | Relative WER to thermal oxide | RI |
|---|---|---|---|---|
| 800 | Single dosing | 1.77 | 1.90 | 1.45 |
| 800 | Double dosing | 1.74 | 1.71 | 1.46 |

The deposition rates show self-limiting behavior and saturates with increasing number of precursor pulses which confirms ALD mode deposition at 800° C.

To confirm ALD mode deposition and no precursor decomposition at 800° C., deposition with HCDSO only without oxygen source is performed. Deposition steps are listed below in Table XI:

TABLE XI

ALD Conditions for Confirming ALD Mode Using HCDSO Only

| Step 1 | 6 sec | Evacuate reactor | <100 mT |
|---|---|---|---|
| Step 2 | 2 sec | Dose Halidosiloxane precursor | Reactor pressure typically <2 Torr |
| Step 3 | 6 sec | Purge reactor with nitrogen | Flow 1.5 slpm $N_2$ |

No films were obtained in the deposition, which confirms no precursor decomposition is occurring during the ALD deposition at 800° C.

To confirm that the oxygen source step does not oxidize the substrate to a significant extent, a deposition was conducted without the halidosiloxane precursor as silicon precursor but only oxygen source step flow. Deposition parameters are provided in Table XII. Silicon oxide growth was not observed by flowing the oxygen source only, suggesting oxygen does not oxidize the substrate to form silicon oxide under the experimental conditions.

TABLE XII

Process for Deposition with Oxygen Source

| Step 1 | 6 sec | Evacuate reactor | <100 mT |
|---|---|---|---|
| Step 2 | 10 sec | Dose ozone | |
| Step 3 | 6 sec | Purge reactor with nitrogen | Flow 1.5 slpm $N_2$ |
| Step 4 | 6 sec | Evacuate reactor | <100 mT |
| Step 5 | 10 sec | Dose $H_2O$ | |
| Step 6 | 6 sec | Purge reactor with nitrogen | Flow 1.5 slpm $N_2$ |

Example 2

Atomic Layer Deposition of Silicon Oxide Films with Hexachlorodisiloxane at Substrate Temperature of 760° C.

Atomic layer deposition of silicon oxide films were conducted with silicon hexachlorodisiloxane (HCDSO) with ozone source using steps listed in Table III. The deposition temperature is 760° C. Multiple precursor pulses were used to study the deposition saturation curve, (i.e. the growth rate reaches plateau in the graph of growth rate vs number of precursor pulses), using HCDSO with ozone reactant. The deposition steps are listed in Table XIII. For multiple pulses, step 2a to 2c are repeated multiple times, then step 3 and step 4 was continued with ozone reactant. Referring again to FIG. 1, FIG. 1 shows the growth rates vs number of precursor pulses showing self-limiting behavior and saturates, (i.e. saturation means reaching plateau with increasing precursor doses in the graph of GPC vs number of precursor pulses which confirms ALD mode deposition at 760° C.). It can be seen that the GPC is saturated with 2 pulses of silicon precursor doses, adding more precursors did not increase GPC further.

TABLE XIII

Process for Atomic Layer Deposition of Silicon Oxide Films with HCDSO and Ozone reactant

| Step 1 | 6 sec | Evacuate reactor | <100 mT |
|---|---|---|---|
| Step 2a | 2 sec | Dose Halidosiloxane precursor | Reactor pressure typically <2 Torr |
| Step 2b | 6 sec | Purge reactor with nitrogen | Flow 1.5 slpm $N_2$ |
| Step 2c | 6 sec | Evacuate reactor | <100 mT |
| Step 3 | 10 sec | Dose ozone | |
| Step 4 | 6 sec | Purge reactor with nitrogen | Flow 1.5 slpm $N_2$ |

Figure 2:
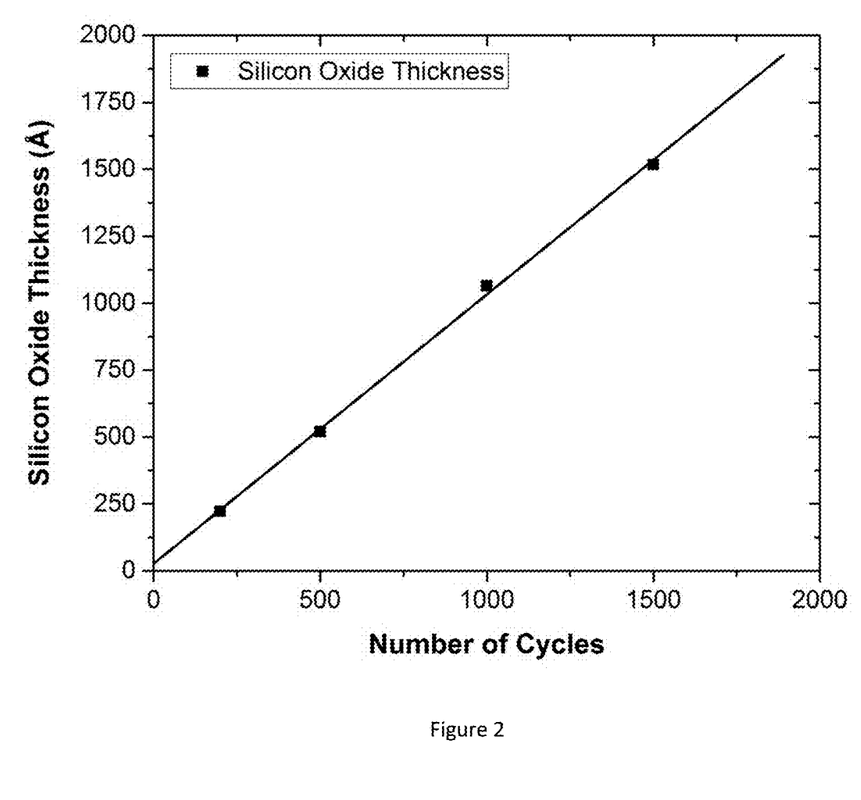
FIG. 2 illustrates the silicon oxide film thickness measured in Å versus the number of cycles using hexachlorodisiloxane (HCDSO) and ozone at 760° C. described in Example 1.

Referring now to FIG. 2, FIG. 2 shows linearity between the thickness of deposited silicon oxide and number of ALD cycles, a characteristics of typical ALD behavior.

Example 3

Figure 3:
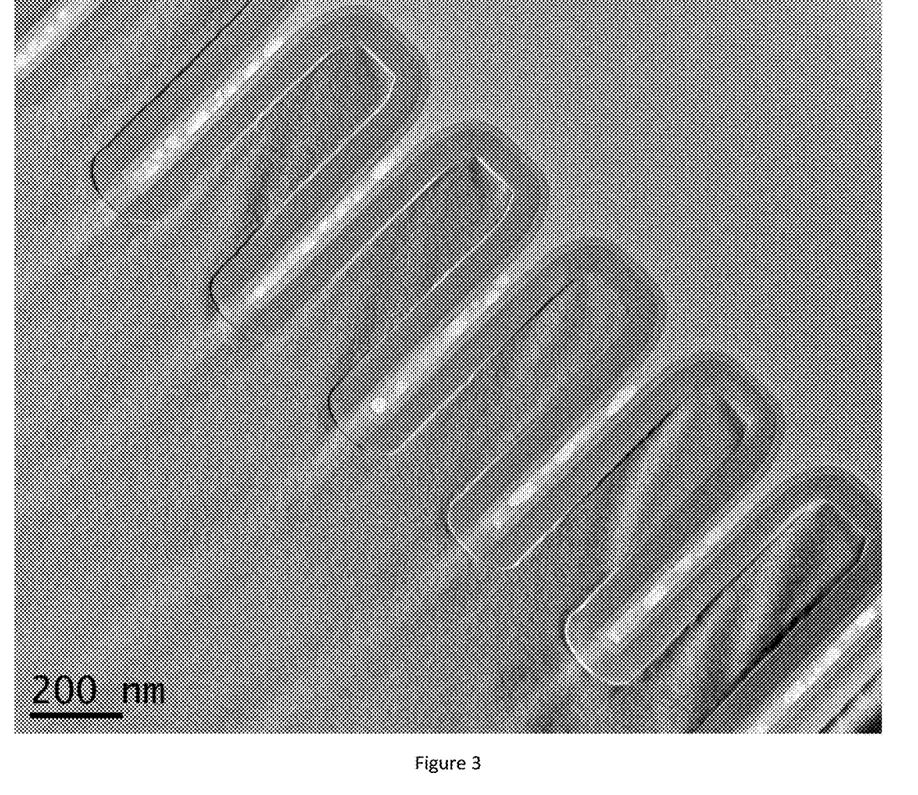
FIG. 3 is a transmission electron microscope (TEM) image of silicon oxide film deposited using hexachlorodisiloxane (HCDSO) and ozone at 760° C.

Atomic Layer Deposition of Silicon Oxide Films on a Patterned Silicon Substrate with HCDSO Silicon oxide film was deposited on patterned silicon wafers with HCDSO at 760° C. The deposition process was performed using ozone as the oxygen source gas and precursor single pulse. The pattern has width ~60 nm, depth ~600 nm, Aspect ratio of 1:10. The film deposited on the substrate was measured using Transmission Electron Microscopy. Referring now to FIG. 3, FIG. 3 is a TEM cross-section of the silicon oxide film indicated excellent step coverage (>95%) (as defined above) and confirmed that the process of Example 3 is indeed an ALD process.

Example 4

Figure 4:
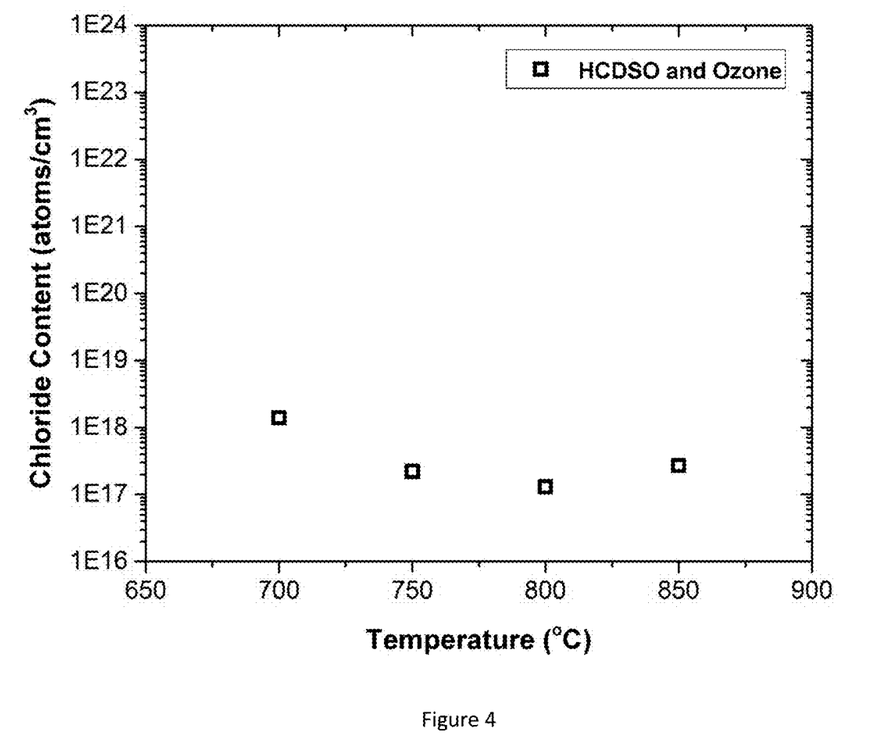
FIG. 4 illustrates the chloride content the silicon oxide films deposited at different temperatures using HCDSO and ozone as described in Example 4
Figure 5:
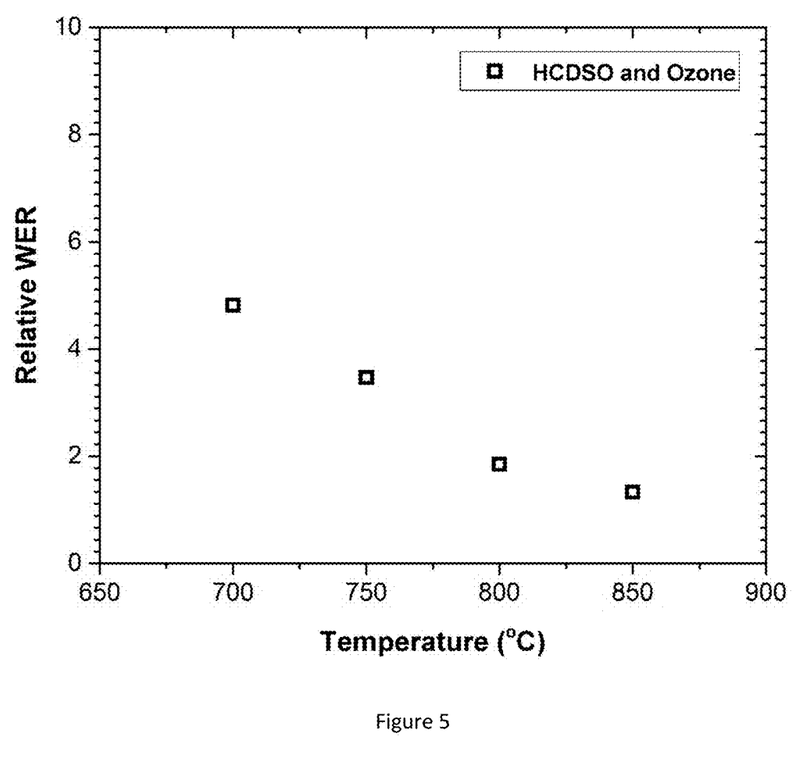
FIG. 5 illustrates the relative WER to thermal oxide for the silicon oxide film deposited at various substrate temperatures with HCDSO and ozone as described in Example 4.

Film Composition of Silicon Oxide Films Deposited by ALD Deposition of HCDSO with Ozone Atomic layer deposition of silicon oxide films were conducted with silicon hexachlorodisiloxane (HCDSO) with ozone source using steps listed in Table III at different temperatures. The film impurities were analyzed by Secondary Ion Mass Spectrometry (SIMS) and film impurities are shown in FIG. 4. Referring now to FIG. 4, FIG. 4 illustrates the chloride content of the deposited films. Referring now to FIG. 5, FIG. 5 shows relative WER to thermal oxide for the silicon oxide film deposited at various substrate temperatures with HCDSO and ozone, demonstrating the higher the temperature, the lower the WER.

Example 5

Atomic Layer Deposition of Silicon Oxide Films with Octachlorotrisiloxane

Atomic layer deposition of silicon oxide films were conducted with silicon precursor octachlrotrisiloxane (OCTSO) with ozone as the reactant using steps listed in Table III. Different numbers of precursor pulses were used at 750° C. to demonstate sel-limiting behavior as shown in FIG. 1, suggesting OCTSO is suitable for high temperature deposition of silicon oxide. The GPC for OCTSO is relatively higher than that of HCDSO. The relative WER compared to thermal oxide is about 2.

Example 6

Atomic Layer Deposition of Silicon Oxide Films with 1,1,3,3-Tetrachloro-1,3-Dimethyldisiloxane

Atomic layer deposition of silicon oxide film was conducted with 1,1,3,3-tetrachloro-1,3-dimethyldisiloxane with ozone as reactant using steps listed in Table III. GPC is 1.18 Å/cycle at 700° C. Film refractive index is 1.46.

While the invention has been described with reference to certain preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the appended claims.

The invention claimed is:

1. A method to deposit a silicon oxide film onto at least a surface of a substrate, the method comprising the steps of:
   a. providing the substrate in a reactor;
   b. introducing into the reactor at least one halidosiloxane precursor selected from the group of compounds having the following formulae I and II:

I

II wherein X=Cl, Br, or I; R and $R^1$ are each independently selected from a hydrogen atom, a $C_1$ to $C_3$ alkyl group; n=1, 2, or 3; m=0, 1, or 2; and p=0 or 1;
   c. purging the reactor with a purge gas;
   d. introducing an oxygen source into the reactor; and
   e. purging reactor with the purge gas; and
   wherein steps b through e are repeated until a desired thickness of the silicon oxide film is deposited; and
   wherein the method is conducted at one or more temperatures ranging from about 700 to 800° C.

2. The method of claim 1, wherein the at least one halidosiloxane precursor is selected from the group consisting of 1,1,1,3,3,3-hexachlorodisiloxane, 1,1,3,3-tetrachlorodisiloxane, 1,1,3,3-tetrachloro-1,3-dimethyldisiloxane, 1,3-dichloro-1,1,3,3-tetramethyldisiloxane, 1,1,1,3,3,5,5,5-octachlorotrisiloxane, 1,1,3,5,5-pentachloro-1,3,5-trimethyltrisiloxane, 1,5-dichloro-1,1,3,3,5,5-hexamethyltrisiloxane, 1,5-pentachloro-1,3,5-trimethyltrisiloxane, and mixtures thereof.

3. The method of claim 1, wherein the purge gas is selected from the group consisting of nitrogen, helium, argon and combinations thereof.

4. The method of claim 1, wherein the oxygen source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen, water vapor, water vapor plasma, a composition comprising water and ozone, hydrogen peroxide, ozone source, and combinations thereof.

5. The method of claim 1, further comprising:
   f. introducing a hydroxyl containing source into the reactor; and
   g. purging reactor with the purge gas, and wherein steps b through g are repeated until a desired thickness of silicon oxide is deposited.

6. A method to deposit a silicon oxide film comprising the steps of:
   a. providing a substrate in a reactor;
   b. introducing into the reactor at least one halidosiloxane precursor selected from the group of compounds having the following formulae I and II:

I

II wherein X=Cl, Br, or I; R and $R^1$ are each independently selected from a hydrogen atom, a $C_1$ to $C_3$ alkyl group; n=1, 2, or 3; m=0, 1, or 2; and p=0 or 1;
   c. purging reactor with a purge gas;
   d. introducing an oxygen source into the reactor;
   e. purging reactor with the purge gas;
   f. introducing a hydroxyl containing source into the reactor;
   g. purging reactor with the purge gas; and
   wherein steps b through g are repeated until a desired thickness of the silicon oxide film is deposited;
   wherein a process temperature ranges from 700 to 800° C. and a pressure ranges from 50 miliTorr (mT) to 760 Torr.

7. The method of claim 6, wherein the at least one halidosiloxane precursor is selected from the group consisting of 1,1,1,3,3,3-hexachlorodisiloxane, 1,1,3,3-tetrachlorodisiloxane, 1,1,3,3-tetrachloro-1,3-dimethyldisiloxane, 1,3-dichloro-1,1,3,3-tetramethyldisiloxane, 1,1,1,3,3,5,5,5-octachlorotrisiloxane, 1,1,3,5,5-pentachloro-1,3,5-trimethyltrisiloxane, 1,5-dichloro-1,1,3,3,5,5-hexamethyltrisiloxane, 1,5-pentachloro-1,3,5-trimethyltrisiloxane, and mixtures thereof.

8. The method of claim 6, wherein the purge gas is selected from the group consisting of nitrogen, helium, argon and combinations thereof.

9. The method of claim 6, wherein the oxygen source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen, water vapor, water vapor plasma, a composition comprising water and ozone, hydrogen peroxide, ozone source, and combinations thereof.

10. A method to deposit a silicon oxide film comprising the steps of:
    a. providing a substrate in a reactor;
    b. introducing into the reactor at least one halidosiloxane precursor selected from the group of compounds having the following formulae I and II:

I

II wherein X=Cl, Br, or I; R and $R^1$ are each independently selected from a hydrogen atom, a $C_1$ to $C_3$ alkyl group; n=1, 2, or 3; m=0, 1, or 2; and p=0 or 1;
    c. purging reactor with a purge gas;
    d. introducing an oxygen source into the reactor;
    e. purging reactor with the purge gas,
    wherein steps b through e are repeated until desired thickness is deposited, and
    wherein a method temperature ranges from 700 to 800° C. and a pressure ranges from 50 miliTorr (mTorr) to 760 Torr and the halidosiloxane precursor comprises at least one anchoring functionality and a passivating functionality comprising a Si-Me or Si—Cl group.

11. The method of claim 10, wherein the oxygen source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen, water vapor, water vapor plasma, a composition comprising water and ozone, hydrogen peroxide, ozone source, and combinations thereof.

12. The method of claim 10, wherein the pressure ranges from 50 miliTorr (mTorr) to 100 Torr.

13. A silicon containing film formed by the method of claim 10.

* * * * *